Nov. 4, 1969 SHIGERU TSUJI 3,476,986

PRESSURE CONTACT SEMICONDUCTOR DEVICES

Filed Sept. 18, 1967

INVENTOR
SHIGERU TSUJI
BY
Hopgood & Calimafde
ATTORNEYS 3,476,986

PRESSURE CONTACT SEMICONDUCTOR DEVICES

Shigeru Tsuji, Tokyo, Japan, assignor to Nippon Electric Company, Limited, Tokyo, Japan, a corporation of Japan Filed Sept. 18, 1967, Ser. No. 668,536
Claims priority, application Japan, Sept. 17, 1966, 41/61,823
Int. Cl. H01l 3/00, 5/00; B23k 31/02
U.S. Cl. 317—234 6 Claims

ABSTRACT OF THE DISCLOSURE

A generally disc-shaped semiconductor device enclosure including a bottom disc, an annular ring of insulating material, a centrally apertured metallic shield and a metallic cap of resilient metal, wherein the semiconductor element is held between said bottom disc and said cap by permanent pressure developed by deformation of said cap upon welding the same to said shield.

Background of the invention

As those knowledgeable in the art are aware, stud-mounted semiconductor devices of conventional design are unsatisfactory for the stringent requirements of reduction in size and weight and for the improved performance possible with such devices. Furthermore, in spite of an increasing demand for miniaturization of electrical components and of the expanding use of semiconductor devices, no satisfactory solution has been forthcoming to meet this problem. With most of the conventional stud-mount designs having base electrodes for mounting semiconductor elements, either soft or hard solders have been used for joining the elements to the bases. Neither solder, however, was satisfactory from the viewpoint of the performance of the device. With those using soft solders for joining the two parts, thermal fatigue or strains would occur in the soft-soldered joints, which resulted eventually in a reduction of the effective life span during which optimum performance could be maintained, while with those using hard solders the high soldering temperatures required would deleteriously affect the device performance. Further, provision of a threaded stud as the anode lead and a terminal as the cathode lead for the stud-mounted semiconductor devices invariably rendered the overall size bulky and also made stacking of a plurality of devices one upon another constructionally impracticable.

Objects of the invention

It is a principal object of this invention to provide a unique, hermetically sealed, and pressure contact semiconductor device featured by structural compactness, economy of manufacure, mechanical rigidity, and improved performance and whereby the above described defects of the conventional designs are entirely eliminated.

All of the objects, features and advantages of this invention and the manner of attaining them will become more apparent and the invention itself will be best understood by reference to the following description of the invention taken in conjunction with the accompanying drawing.

Summary of the invention

In accordance with this invention, there is provided an improved disc-shaped, hermetically sealed enclosure for semiconductor devices which includes a flat-bottomed disc as the base of an enclosure for mounting a semiconductor element, an annular member or a circular ring member of insulating material superposed on the base disc concentrically therewith, a centrally apertured metallic shield superposed on the insulating member concentrically therewith, and a metallic cap of resilient metal with a suitable geometrical configuration for maintaining electrically and thermally conductive contact between the cap and the semiconductor and between the semiconductor and the base disc by permanent pressure developed on deformation of the geometrical configuration of the cap after the cap and the shield have been welded together to hermetically seal the enclosure.

Extreme compactness and a particular shape adapted for stacking a desired number of devices, economy of manufacture, an increase in output due to sufficient heat dissipation capability, and other features will be evident from the following more detailed description of the pressure contact semiconductor device embodying this invention.

Description of preferred embodiment

Figure 1:
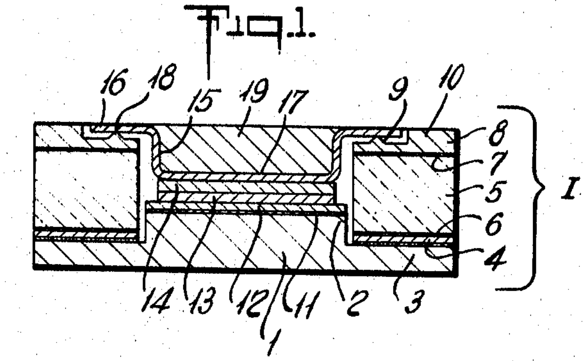
FIGURE 1 is a longitudinal cross-sectional view of a hermetically disc-shaped semiconductor device constructed in accordance with a preferred embodiment of this invention.

Referring to FIGURE 1, the numeral 1 denotes a base disc having a flat bottom surface and serving as both an electrode and a heat sink for a semiconductor element. This disc should be made of a metal or an alloy excellent both in electrical and heat conduction such as copper, silver, aluminum, or an alloy of such metal. Of these metals and alloys, copper or a copper alloy would be most preferred in view of the described purpose. The base disc 1 has a centrally raised, level surface circular mount projection 2 as a mount for a semiconductor element. A thin disc 12 made of molybdenum or tungsten or an alloy of such metal is secured to the top of the mount projection 2. A thin disc 11 of a comparatively soft metal having good electrical and heat conductivity such as gold, silver, or an alloy of such metal may be inserted between the thin electrode disc 12 and the mount 2. This thin disc 11 serves not only to ensure electrical connection between the disc 12 and the mount projection 2, but also to compensate for the roughness of the surface of the disc 12 or the mount projection 2.

On the thin disc 12, a semiconductor element 13, i.e. a semiconductor diode in this case, is mounted. It is desirable that the semiconductor element 13 have a thermal expansion coefficient as close as possible to that of the disc 12. The semiconductor element 13 may be joined to the disc 12 by a conventional brazing process.

The numeral 15 denotes a dish-shaped cap having a generally spherical-surfaced bottom and made of a metal such as Fe-Ni alloy or spring steel of sufficient resiliency for exerting a pressure on the semiconductor element 13 on deformation thereof after it has been fabricated in the enclosure. As fabricated, the cap 15 becomes another electrode and the inwardly raised circular flat bottom surface 17 of the cap serves as the contact surface. A thin metal disc 14 made of a comparatively soft metal or alloy such as copper, silver, aluminum, or an alloy of such metals and having good electrical and thermal conductivity is placed, as required, between the upper surface of the semiconductor element 13 and the contact surface 17 of the cap 15. The insertion of such a member compensates for any roughness of the contact surface 17 in order to provide perfect contact with the semiconductor and to protect the semiconductor element from a possible fracture that may otherwise be caused due to application of too large or uneven a pressure.

In order that this structure may be effective with the pressure contact semiconductor device, it is necessary that the anode and cathode of the semiconductor rectifier element 13 maintain excellent electrically and thermally conductive contact with the thin disc 12 and the contact surface 17, respectively. In other words, the sub-assembly must be clamped securely by suitable pressure between the cap and the base disc at the completion of fabrication of the device.

To meet this requirement, this invention uses a combination of a shallow, circular receptacle with one end closed by the base as shown in FIG. 1 and a circular cap 15 of a resilient metal which will provide perfect electrical continuity and thermal conduction with the semiconductor element by an even pressure to be produced on deformation of the cap, for instance, from a spherically shaped bottom surface into a flat-bottom shaped surface within the elastic limit of the resilient metal as a resistance welding process is conducted for hermetically sealing the enclosure. The circular receptacle I, with a shallow depression, the lower end of which is closed by the base disc 1 is made of a combination of metals and an insulating material such as glass or ceramic. In this embodiment, the annular member between the base disc and the metallic shield is made of a ceramic material. Typically, the receptacle I is of the order of 12 mm. in height and 40 mm. in diameter.

A centrally apertured thin metallic disc 4 having an inside diameter slightly larger than the diameter of the mount 2 and an outside diameter approximately equal to the diameter of the base disc 1 is loosely fitted around the mount projection 2 and placed on the flange of base 1, on this disc 4 is then placed an annular ceramic insulating member 5 having predetermined dimensions and an outer diameter preferably equal to the diameter of the thin apertured disc 4. In order to produce perfect hermetic sealing by brazing, the upper flange surface of the base disc 1 and the top and bottom surfaces of the ceramic insulating member must be metallized with a suitable layer of metal 6 such as silver, molybdenum, or an alloy of Mo-Mn. If necessary, the ceramic insulating member 5 may be brazed directly to the base disc 1 without using the thin apertured disc 4. The circular receptacle I, the lower end of which is closed by the base disc 1, may be accomplished by superposing a metallic shield 8 having a raised circular surface 10 at the outer circumference and a sharp edge projection 9 near the inner circumference, upon the annular ceramic insulating member 5 so as to be concentric therewith and then hermetically sealing the respective surfaces with a silver hard solder or other suitable solder 7.

Both the thin apertured metallic disc 4 and the metallic shield 8 should have thermal expansion coefficients as close as possible to that of the ceramic member 5 in order to directly braze the two to the ceramic member. It has been found that a nickel-iron or a nickel-iron-cobalt alloy is most appropriate for both the shield and the thin apertured disc when the insulating member 5 is made of an alumina ceramic.

The circular cap 15 should have a flat bottom surface 17 upon completion of assembly of the device, to serve as the cathode contact surface for applying an even pressure on the semiconductor element, thereby providing an excellent electrically and thermally conductive contact therefor. The cap 15 also has a flange 16 for hermetically sealing the enclosure by a resistance-welding process.

Figure 2:
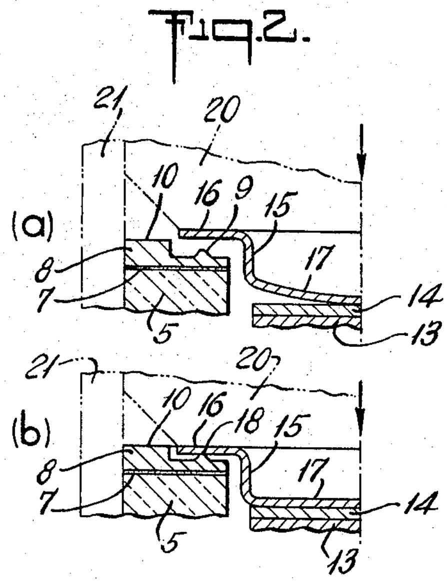
FIGURES 2*a* and 2*b* are longitudinal cross-sectional views in an enlarged scale of a critical part of the device of FIGURE 1, before and after a welding process for fabrication of the device, respectively.

In fabricating the enclosure, see FIGS. 2*a* and 2*b*, the electrodes of an electric welder are applied across the flange 16 and the shield 8 with the flange of the cap 15 positioned just above the shield and concentrically therewith. The flange 16 of the cap is pressed down to the sharp top edge 18 of the projection 9 of the shield 8 by the electrodes until the lower surface of the flange 16 is in perfect contact with this top edge 18. A current is then made to flow between the electrodes of the welder, so that the flange 16 and the shield 8 are fused together at the projection 9. The disk-shaped enclosure is thus hermetically sealed, and the semiconductor sub-assembly is securely clamped between the cap 15 and the base 1.

FIGS. 2*a* and 2*b* show the manner in which the originally spherically shaped bottom surface 17 of the circular cap 15 is deformed into planar shape by a welder electrode 20 which slides down a guide 21. The pressure shown by the arrows in FIGS. 2*a* and 2*b* is typically of the order of 100 kg./cm.$^2$ or more.

Thus it will be seen that the flat-bottomed cap 15 can exert an even pressure on the semiconductor as a pressure applying device by reason of the resiliency of the metal of which the cap is made. Obviously, the geometry, material and thickness of the circular, flanged cap 15 can be suitably selected or determined, so that the appropriate pressure required for pressing down the semiconductor assembly may be achieved. The pressure should be as large as possible and should be larger than the value necessary to keep the semiconductor element from shifting position.

After the enclosure has been hermetically sealed by the cap 15, which serves as another heat sink for the semiconductor device, the depression of the cap may be filled with a suitable filler metal 19 having good thermal conductivity such as Ag-Pb alloy or Ag-Pb-Sn alloy to increase the overall heat sink capacity and the electrical output of the device. The filler metal 19 must be reasonably soft and have a melting point which will not deleteriously affect the performance of the device.

From the foregoing description it will be evident that the present invention provides a unique, miniaturized, pressure-contact structure featuring mechanical sturdiness combined with improved performance and reliable operation without impairing the electrical and thermal conduction capabilities as compared with stud-mounted structures. This construction also permits stacking a number of semi-conductor devices as desired.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A pressure contact formed semiconductor device comprising:

a base plate to support a semiconductor element on a central portion and made of an electrically and thermally conductive metal, an insulating member having a bore extending therethrough and being hermetically fixed to the base plate with the bore in registration with the central portion of the base plate, said insulating member being provided with a metallized surface portion surrounding the bore at the member end located opposite of the base plate, a semiconductor element placed within the bore with a first surface in electrical contact with the central portion of the base plate, and a cap made of a resilient metal and having a depressed central portion and a flange surrounding the central portion, said central portion having a normally arcuate shape bulging outwardly away from the flange for pressure contact with a second semiconductor element surface opposite the first surface, said flange extending over the metallized surface portion of the insulating member and being normally spaced above said surface portion a distance chosen to assure a planar pressure contact of the cap central portion with the second semiconductor element surface upon the joining of the flange to said metallized raised surface portion on the insulator member.

2. The pressure contact semiconductor device according to claim 1, wherein the external central depression of said cap is filled with a cast metal having good thermal conductivity.

3. The device as recited in claim 1 wherein the base plate central portion and the depressed central portion of the cap facing the semiconductor element are provided with soft metallic surfaces to enhance electrical and thermal contact with the semiconductor element and smooth out surface irregularities on the cap and base plate.

4. The device as recited in claim 1 wherein said base plate is circular with an elevated semiconductor element supporting central portion surrounded by an annular base plate flange, and wherein said insulator member is annular and sized to hermetically mount to the annular base plate flange and axially extends above the elevated central portion and the semiconductor element, with the metallic surface portion being an annular raised portion concentric with the elevated central base plate portion and wherein the cap flange is annular and is connected to the depressed portion with an annular wall substantially parallel to the axis of the insulating member to further enhance the planar pressure contact between the cap and the semiconductor element.

5. A method of forming a semiconductor element with pressure contacts comprising the steps of:

hermetically assembling an apertured insulator having a metallic surface in surrounding relationship with the aperture of the insulator to an electrically and thermally conducting base plate with the aperture in registration with a portion of the base plate and with the surface of the insulator facing away from the base plate, assembling a metallic resilient cap with a depressed central portion and a flange surrounding the central portion with the central portion having a normally arcuate shape bulging outwardly away from the flange, a semiconductor element located within the insulator aperture in electrical contact with the base plate portion, compressing the flange of the cap towards the metallic surface of the insulator to flatten the normally arcuate depressed portion of the cap into planar electrical and thermal contact with the semiconductor element, and bonding the compressed flange to the insulator at the metallic surface thereof.

6. The method as recited in claim 5 wherein the bonding step comprises resistance welding the compressed flange to the insulator at a raised metallic surface thereof.

References Cited

UNITED STATES PATENTS

| | | | |
|---|---|---|---|
| 3,234,437 | 2/1966 | Dumas | 317—234 |
| 3,293,508 | 12/1966 | Boyer | 317—234 |
| 3,293,509 | 12/1966 | Emeis | 317—234 |
| 3,313,987 | 4/1967 | Boyer | 317—234 |
| 3,396,316 | 8/1968 | Wislocky | 317—234 |

JOHN W. HUCKERT, Primary Examiner

R. F. POLISSACK, Assistant Examiner

U.S. Cl. X.R.

29—484, 589